(12) United States Patent
Hwang (10) Patent No.: US 9,345,167 B2
(45) Date of Patent: May 17, 2016

(54) CONTAINER DATA CENTER

(71) Applicant: HON HAI PRECISION INDUSTRY CO., LTD., New Taipei (TW)

(72) Inventor: Ching-Bai Hwang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/561,390

(22) Filed: Dec. 5, 2014

(65) Prior Publication Data

US 2016/0105994 A1    Apr. 14, 2016

(30) Foreign Application Priority Data

Oct. 14, 2014    (CN) .......................... 2014 1 0538781

(51) Int. Cl.
| | |
|---|---|
| *H05K 7/20* | (2006.01) |
| *H05K 5/00* | (2006.01) |
| *H05K 5/02* | (2006.01) |
| *G06F 1/20* | (2006.01) |

(52) U.S. Cl.
CPC .......... *H05K 7/20145* (2013.01); *H05K 5/0017* (2013.01); *H05K 5/0213* (2013.01); *H05K 5/0247* (2013.01); *H05K 7/20736* (2013.01)

(58) Field of Classification Search
CPC ... H05K 7/20; H05K 7/1497; H05K 7/20745; H05K 7/20836; H05K 5/00; H05K 5/02; G06F 1/20; G06F 1/206; G05B 15/02; H01L 23/467; H01L 23/747; F24F 7/04; F24F 13/00
USPC ........................ 361/679.46–679.53, 690–696, 361/724–728, 688, 689, 698, 699; 165/80.2, 80.4, 80.5, 104.33, 104.34, 165/121–126, 185, 202, 287; 454/184; 62/259.2; 312/223.2, 236, 265; 700/299, 300; 29/592, 592.1

See application file for complete search history.

(56) References Cited

U.S. PATENT DOCUMENTS

| | | | | |
|---|---|---|---|---|
| 7,961,463 B2 * | 6/2011 | Belady | ............... | H05K 7/20745 312/223.6 |
| 7,990,710 B2 * | 8/2011 | Hellriegel | ............... | G06F 1/183 165/104.33 |
| 8,047,904 B2 * | 11/2011 | Yates | .................... | B65D 88/745 454/118 |
| 8,315,054 B2 * | 11/2012 | Chen | .................. | H05K 7/20745 361/679.47 |
| 8,331,087 B2 * | 12/2012 | Wei | ...................... | H05K 7/1497 174/520 |
| 8,405,977 B2 * | 3/2013 | Lin | .................... | H05K 7/20736 312/223.2 |
| 8,462,496 B2 * | 6/2013 | Schmitt | ...................... | G06F 1/20 165/104.33 |
| 8,498,110 B2 * | 7/2013 | Wei | .................... | H05K 7/20745 165/104.33 |
| 8,873,235 B2 * | 10/2014 | Chen | .................. | H05K 7/20836 361/694 |
| 9,152,191 B1 * | 10/2015 | Gardner | .................. | G06F 1/206 |

(Continued)

*Primary Examiner* — Michail V Datskovskiy
(74) *Attorney, Agent, or Firm* — Novak Druce Connolly Bove + Quigg LLP (57) ABSTRACT

A container data center includes a container, a number of server cabinets received in the container, a heat dissipation apparatus, a ventilation pipe, and a control device. The container defines a number of air inlets and a number of air outlets. A number of first shielding plates movably coupled to the container to cover the air inlets and a number of second shielding plates movably coupled to the container to cover the air outlets. The container forms a cooling air channel at one side of the server cabinets and a heat air channel at an opposite side of the server cabinets. The ventilation pipe is communicated between the heat dissipation apparatus and at least one of the air inlets, the ventilation pipe defines a opening communicating with the heating air channel, and a third shielding plate is movably coupled to the ventilation pipe to cover the corresponding through hole.

20 Claims, 6 Drawing Sheets

(56) References Cited

U.S. PATENT DOCUMENTS

| | | | | |
|---|---|---|---|---|
| 2008/0123288 A1* | 5/2008 | Hillis | H05K 7/20745 | 361/679.34 |
| 2010/0051563 A1* | 3/2010 | Schreiber | H05K 7/1497 | 211/26 |
| 2011/0151765 A1* | 6/2011 | Chen | H05K 7/20745 | 454/184 |
| 2011/0175498 A1* | 7/2011 | Bash | F24F 11/0001 | 312/107 |
| 2012/0142265 A1* | 6/2012 | Wei | H05K 7/20745 | 454/184 |
| 2014/0168887 A1* | 6/2014 | Lai | H05K 7/20836 | 361/679.46 |

* cited by examiner

CONTAINER DATA CENTER

FIELD

The subject matter herein generally relates to data centers, and particularly to a container data center.

BACKGROUND

With increasing use of on-line applications, the need for computer data centers has increased rapidly. Data centers are centralized computing facilities that include many servers, often arranged on server racks or shelves, and one rack or shelf with some servers can be considered a server system. During operation, server systems generate heat in the data centers, and the heat can be dissipated by using air conditioners.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a container data center.

Figure 1:
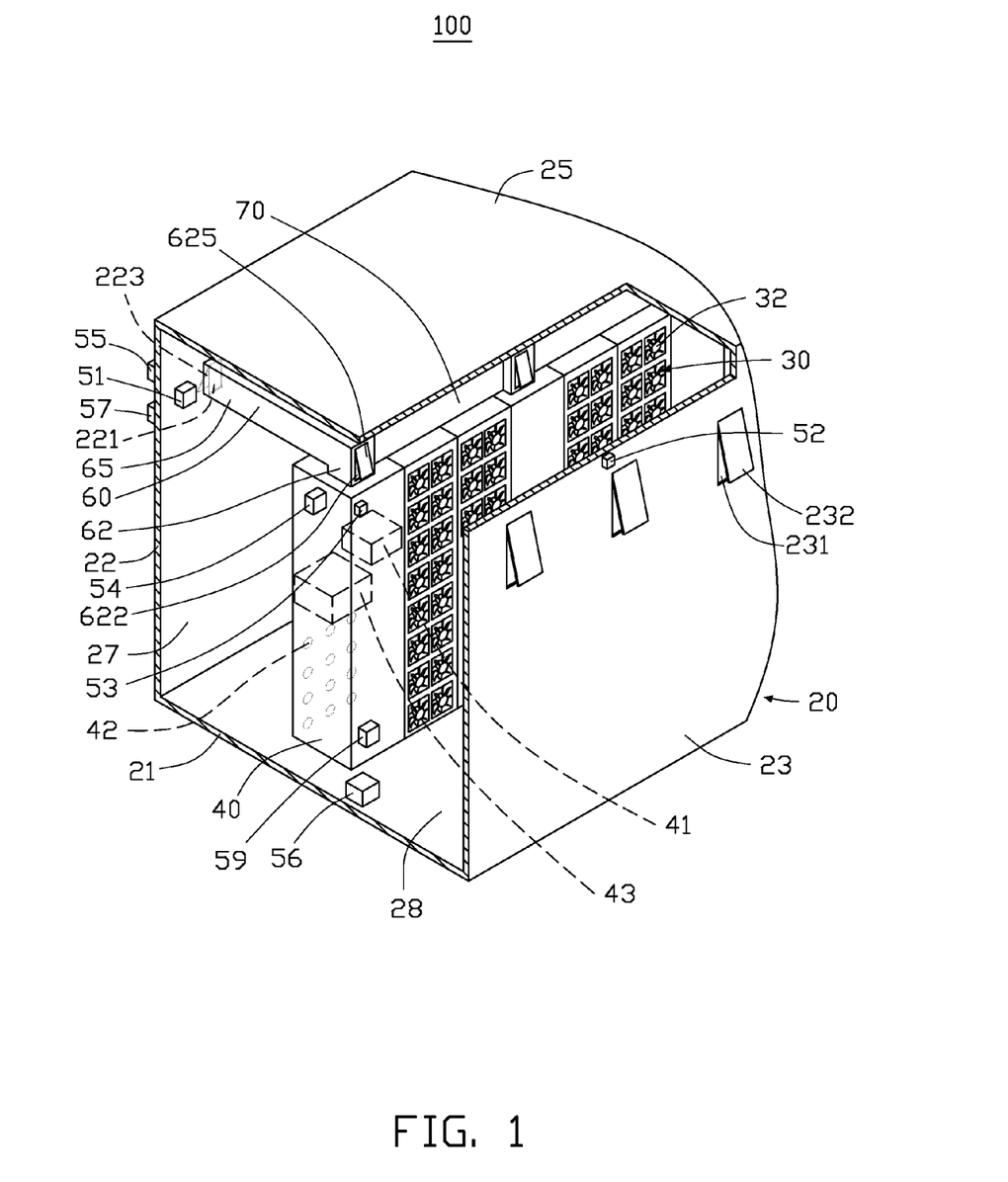
FIG. 1 is an isometric, partially cutaway view of a first embodiment of a container data center.
Figure 2:
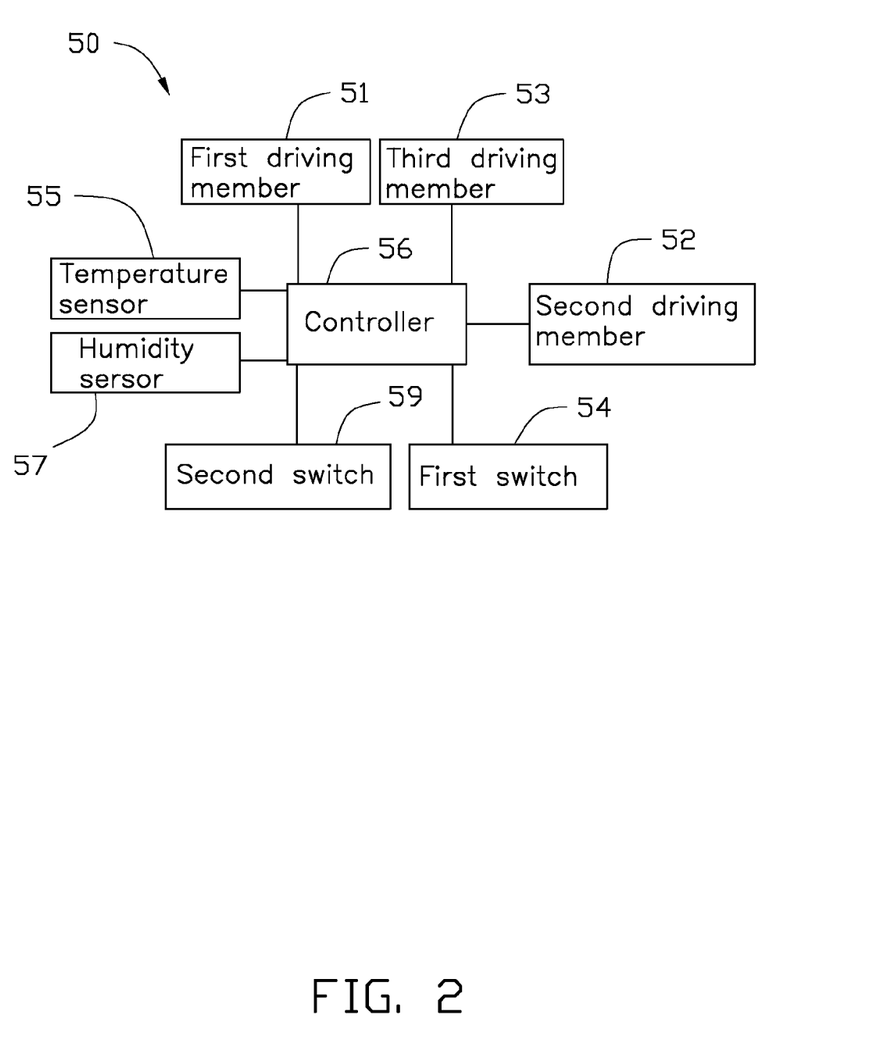
FIG. 2 is a block diagram of a control device of the container data center of FIG. 1.

FIGS. 1 and 2 illustrate a first embodiment of a container data center 100. The container data center 100 comprises a container 20, a row of server cabinets 30 received in the container 20, a plurality of heat dissipation apparatus 40, a control device 50, a plurality of ventilation pipes 60, and a partition plate 70.

The container 20 comprises a substantially rectangular bottom wall 21, a first sidewall 22 substantially perpendicularly extending up from one side of the bottom wall 21, a second sidewall 23 substantially perpendicularly extending up from the other side of the bottom wall 21 opposite to the first sidewall 22, and a top wall 25 opposite to the bottom wall 21 and coupled between tops of the first sidewall 22 and the second sidewall 23. An upper portion of the first sidewall 22 defines a plurality of air inlets 221, and the air inlets 221 can be arranged in a lengthwise direction of the first sidewall 22. A plurality of first shielding plates 223 can be rotatably coupled to the first sidewall 22 to cover the air inlets 221. An upper portion of the second sidewall 23 defines a plurality of air outlets 231, and the air outlets 231 can be arranged in a lengthwise direction of the second sidewall 23. A plurality of second shielding plates 232 can be rotatably coupled to the second sidewall 23 to cover the air outlets 231. The server cabinets 30 are located on the bottom wall 21 between the first sidewall 22 and the second sidewall 23, and arranged in the lengthwise direction of the bottom wall 21. The first sidewall 22 and the server cabinets 30 cooperatively bind a cooling air channel 27. The second sidewall 23 and the server cabinets 30 cooperatively bind a heat air channel 28. Each server cabinet 30 comprises a plurality of fans 32 facing the heat air channel 28. The air outlets 231 communicate with the heat air channel 28.

The heat dissipation apparatus 40 are arranged in a line with the server cabinets 30, and each two adjacent heat dissipation apparatus 40 sandwich one or two server cabinets 30. A lower portion of each heat dissipation apparatus 40 defines a plurality of vents 42 communicating with the cooling air channel 27. Each heat dissipation apparatus 40 comprises a refrigeration unit 41 and an exhaust fan 43.

The ventilation pipes 60 can be installed on tops of the corresponding heat dissipation apparatus 40. Each ventilation pipe 60 comprises a first coupling end 62 connected to a top of the corresponding heat dissipation apparatus 40 and communicating with interior of the corresponding heat dissipation apparatus 40, and a second coupling end 65 coupling to the first sidewall 22 and communicating with the corresponding air inlet 221. The first coupling end 62 of each ventilation pipe 60 defines an opening 622 communicating with the heat air channel 28. A third shielding plate 625 can be rotatably coupled to the first coupling end 62 of each ventilation pipe 60 to cover the corresponding opening 622. The partition plate 70 is located between an inner surface of the top wall 25 and tops of the server cabinets 30 and the heat dissipation apparatus 40.

The control device 50 comprises a first driving member 51 configured to drive the first shielding plates 223 to rotate, a second driving member 52 configured to drive the second shielding plates 232 to rotate, a third driving member 53 configured to drive the third shielding plates 625 to rotate, a temperature sensor 55, a humidity sensor 57, a first switch 54 to control the exhaust fans 43, a second switch 59 to control the refrigeration units 41 of the heat dissipation apparatus 40, and a controller 56 electrically coupled to the first driving member 51, the second driving member 52, the third driving member 53, the temperature sensor 55, the humidity sensor 57, the first switch 54, and the second switch 59. The temperature sensor 55 and the humidity sensor 57 are installed to an outer side of the first sidewall 22, and located adjacent to the air inlets 221, for sensing a temperature and a humidity of an air outside of the container 20. The controller 56 can compare temperature sensed by the temperature sensor 55 with predetermined temperature saved in the controller 56 and humidity sensed by the humidity sensor 57 with a predetermined humidity saved in the controller 56, to control the first driving member 51, the second driving member 52, and the third driving member 53 to rotate the first shielding plates 223, the second shielding plates 232, and the third shielding plates 625, to open or shield the air inlets 221, the air outlets 231, and the openings 622, and control the first switch 54 to turn on or turn off the exhaust fans 43, and control the second switch 59 to turn on or turn off the refrigeration units 41.

In the embodiment, the first driving member 51, the second driving member 52, and the third driving member 53 are motors.

Figure 3:
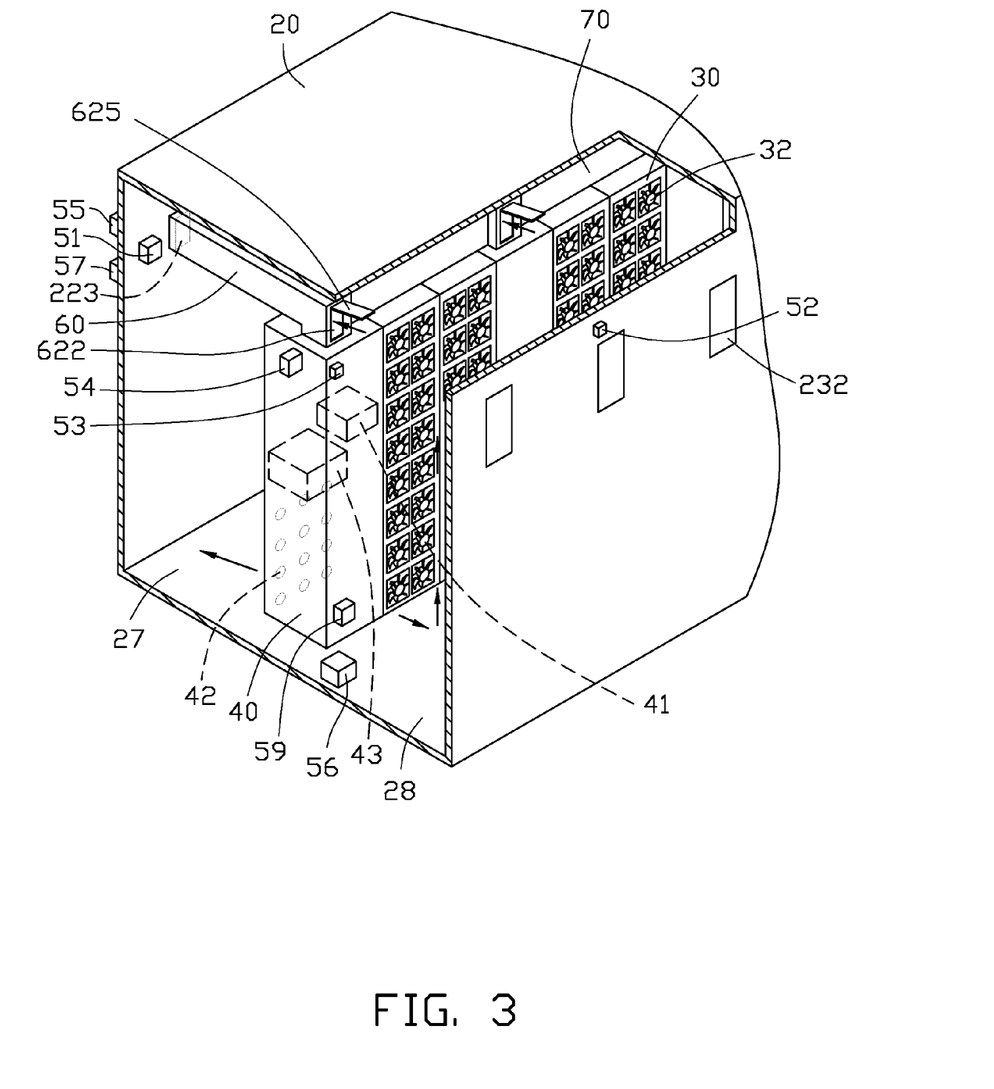
FIG. 3 is similar to FIG. 1, but shows the container data center in a first state.
Figure 4:
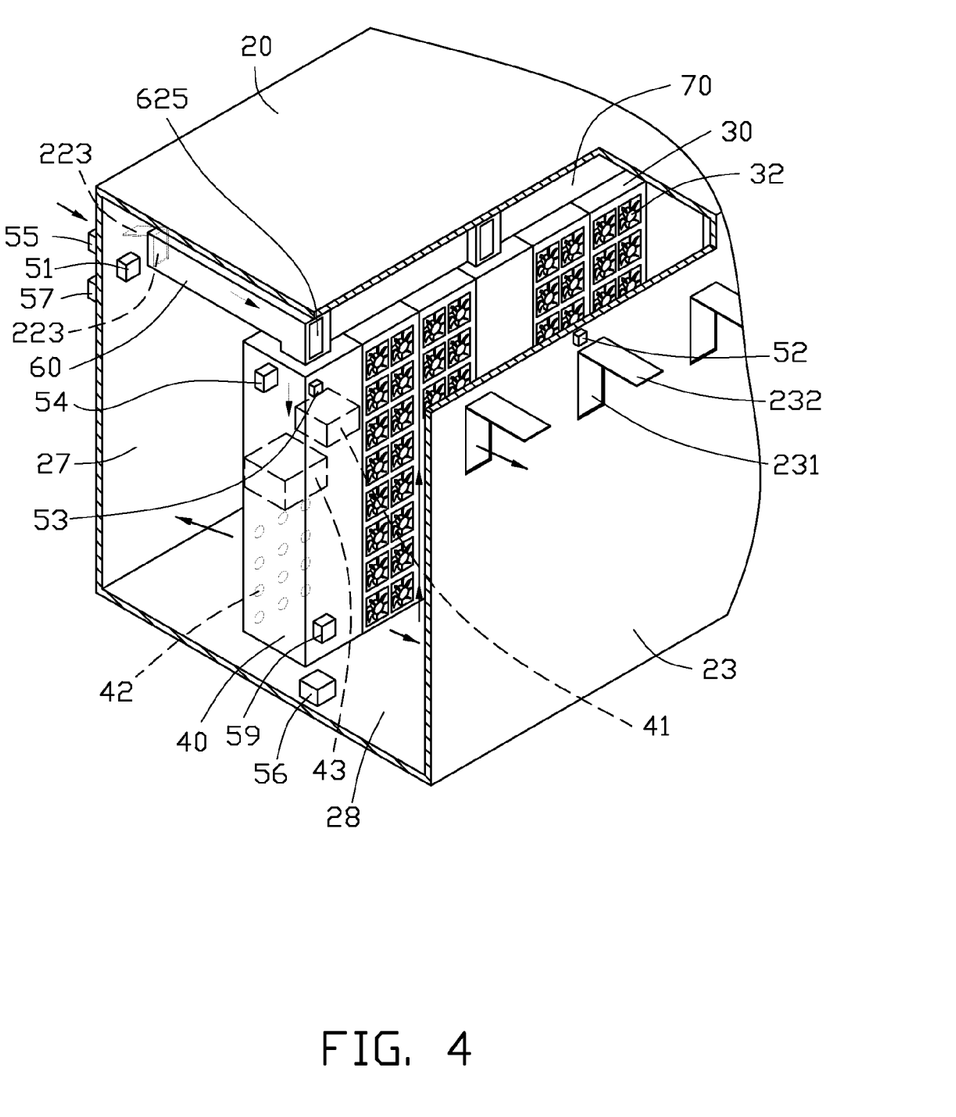
FIG. 4 is similar to FIG. 1, but shows the container data center in a second state.
Figure 5:
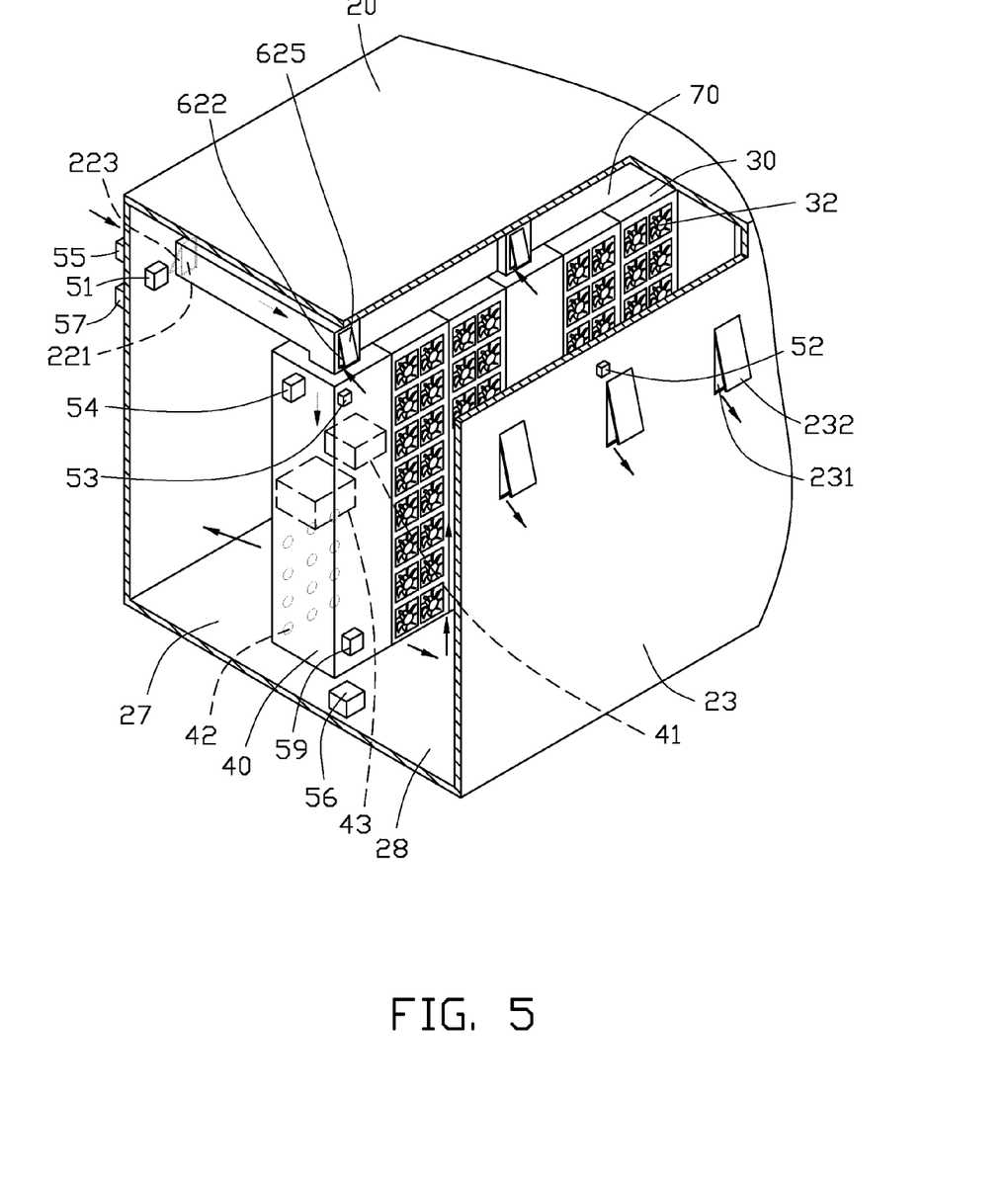
FIG. 5 is similar to FIG. 1, but shows the container data center in a third state.

FIGS. 3-5 illustrate the container data center 100 in three usage states.

As shown in FIG. 3, if the sensed temperature of the air outside of the container 20 is greater than a first predetermined temperature, such as more than thirty-five degree Celsius, the controller 56 controls the first driving member 51, the second driving member 52, and the third driving member 53 to rotate the first shielding plates 231, the second shielding plates 232, and the third shielding plates 625. The first shielding plates 223 are rotated toward the first sidewall 22 to shield the air inlets 221, the second shielding plates 232 are rotated toward the second sidewall 23 to shield the air outlets 231, and the third shielding plates 625 are rotated away from the corresponding ventilation pipes 60 to open the openings 622. The controller 56 controls the second switch 59 to turn on the refrigeration units 41 to cool air. The cool air flows into the cooling air channel 27 through the vents 42 of the heat dissipation apparatus 40, and is drawn by the fans 32 to pass though the server cabinets 30 and becomes heated air by absorbing heat of the server cabinets 30. The heated air flows into the heat air channel 28, and enters into the heat dissipation apparatus 40 through the openings 622. The refrigeration units 41 in the heat dissipation apparatus 40 cool the heated air again.

As shown in FIG. 4, if the sensed temperature of the air outside of the container 20 is less than the first predetermined temperature and the sensed humidity of air outside of the container 20 is less than the predetermined humidity, the controller 56 controls the first driving member 51, the second driving member 52, and the third driving member 53 to rotate the first shielding plates 55, the second shielding plates 232, and the third shielding plates 625. The first shielding plates 223 are rotated away from the first sidewall 22 to open the air inlets 221, the second shielding plates 232 are rotated away from the second sidewall 23 to open the air outlets 231, and the third shielding plates 625 are rotated toward the ventilation pipes 60 to shield the openings 622. The controller 56 controls the second switch 59 to turn off the refrigeration units 41, and controls the first switch 54 to turn on the exhaust fans 43. The air outside of the container 20 flows into the ventilation pipes 60 through the air inlets 221, passes though the heat dissipation apparatus 40, and enters into the cooling air channel 27 through the vents 42. The air is drawn by the fans 32 to pass through the server cabinets 30 and becomes heated air by absorbing heat of the server cabinets 30. The heated air can flow into the heat air channel 28, and can flow out of the container 20 through the air outlets 231.

As shown in FIG. 5, if the sensed temperature of the air outside of the container 20 is less than the first predetermined temperature and the sensed humidity of the air outside of the container 20 is greater than the predetermined humidity, or if the sensed temperature of the air outside of the container 20 is less than a second predetermined temperature which is less than the first predetermined, such as ten degree Celsius. The controller 56 controls the first driving member 51, the second driving member 52, and the third driving member 53 to rotate the first shielding plates 55, the second shielding plates 232, and the third shielding plates 625. The first shielding plates 223 are rotated away from the first sidewall 22 to open a part of the air inlets 221, the second shielding plates 232 are rotated away from the second sidewall 23 to open a part of the air outlets 231, and the third shielding plates 625 are rotated away from the corresponding ventilation pipes 60 to open a part of the openings 622. The controller 56 controls the second switch 59 to turn off the refrigeration units 41, and controls the first switch 54 to turn on the exhaust fans 43. The air outside of the container 20 is drawn into the ventilation pipes 60 through the air inlets 221 of the first sidewall 22 by the exhaust fans 43, and a part of heated air in the heat air channel 28 is drawn into the ventilation pipes 60 through the openings 622 by the exhaust fans 43, the two parts of air in the ventilation pipes 60 are mixed to form a mixed air. The mixed air passes through the heat dissipation apparatus 40, and enters into the cooling air channel 27 through the vents 42. The mixed air is drawn by the fans 32 to pass through the server cabinets 30 and becomes heated air by absorbing heat of the server cabinets 30. The heated air can flow into the heat air channel 28, one part of the heated air flows out of the container 20 through the air outlets 231, and the other part of the heated air flows into the ventilation pipes 60 through the openings 622 again.

Figure 6:
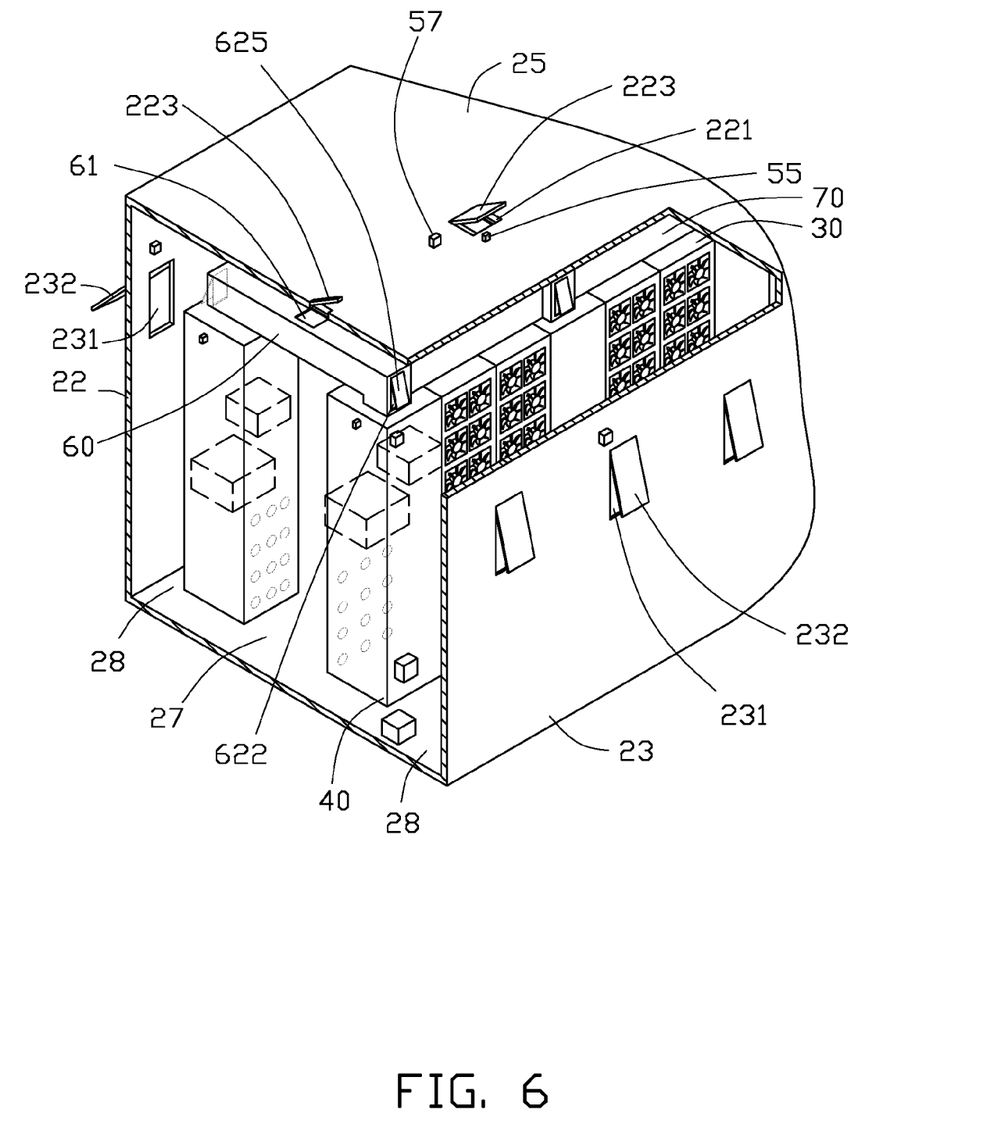
FIG. 6 is an isometric, partially cutaway view of a second embodiment of a container data center.

FIG. 6 illustrates a second embodiment of a container data center, which is similar to the first embodiment of the container data center. In the second embodiment, the container data center comprises two rows of opposites and spaced server cabinets 30 received in the container 20 and a plurality of spaced heat dissipation apparatus 40 arranged in each row of server cabinets 30. Each heat dissipation apparatus 40 of one row of the server cabinets 30 is aligned with the opposite heat dissipation apparatus 40 of the other row of the server cabinets 30. The two rows of server cabinets 30 are cooperatively bind a cooling air channel 27. The two rows of server cabinets 30 and the first sidewalls 22, the second sidewalls 23 are cooperatively bind two heat air channels 28. The top wall 25 defines a plurality of air inlets 221 above the cooling air channel 27 and communicating with the cooling air channel 27. The plurality of air inlets 221 are arranged along a longwise direction of the top wall 25. A plurality of first shielding plate 223 can be rotatably coupled to the top wall 25 to cover the air inlets 221. A ventilation pipe 60 is supported on tops of each two opposite heat dissipation apparatus 40, and two opposite ends of the ventilation pipe 60 are respectively coupled to the two opposite heat dissipation apparatus 40. A top of the ventilation pipe 60 is engaged with the top wall 25, and the top of each ventilation pipe 60 defines a through hole 61 aligning with the corresponding air inlet 221. Each of the first sidewall 22 and the second sidewall 23 defines a plurality of air outlets 231 communicating with the corresponding heat air channels 28. A plurality of second shielding plates 232 can be rotatably coupled to the first sidewall 22 and the second sidewall 23 to cover the air outlets 231. The two opposite ends of each ventilation pipe 60 define two openings 622 communicating with the corresponding heat air channels 28. Two third shielding plates 625 can be rotatably coupled to each ventilation pipe 60 to cover the corresponding openings 622. A partition plate 70 is located between an inner surface of the top wall 25 and a top of each row of server cabinets 30. A temperature sensor 55 and a humidity sensor 57 are installed to an outer surface of the top wall 25, and located adjacent to the air inlets 221. Working method of the second embodiment of the container data center is the same as the working method of the first embodiment of the container data center.

In another embodiment, each first shielding plate 223 and each second shielding plate 232 can be slidably coupled to the container 20 to cover the corresponding air inlet 221 and the corresponding air outlet 231, each third shielding plate 625 can be slidably coupled to the corresponding ventilation pipe 60 to cover the corresponding opening 622.

Even though numerous characteristics and advantages of the embodiments have been set forth in the foregoing description, together with details of the structure and function of the embodiments, the present disclosure is illustrative only, and changes may be made in detail, including in the matters of shape, size, and arrangement of parts within the principles of the embodiments to the full extent indicated by the broad general meaning of the terms in which the appended claims are expressed.

What is claimed is:

1. A container data center comprising:
a container receiving a plurality of server cabinets, the container forming a cooling air channel at one side of the server cabinets and a heat air channel at an opposite side of the server cabinets, the container defining a plurality of air inlets communicating with the cooling air channel and a plurality of air outlets communicating with the heat air channel, and the container comprising a plurality of first shielding plates movably coupled to the container to cover the corresponding air inlets and a plurality of second shielding plates movably coupled to the container to cover the corresponding air outlets;
a heat dissipation apparatus located between the server cabinets, wherein the heat dissipation apparatus comprises an exhaust fan, and defines a plurality of vents communicating with the cooling air channel; and
a control device comprising a first driving member configured for driving the first shielding plates to move, a second driving member configured for driving the second shielding plates to move, a temperature sensor mounted to an outer side of the container, a first switch configured for controlling the exhaust fan, and a controller electrically coupled to the first driving member, the second driving member, the temperature sensor, and the temperature sensor;
wherein, according to a temperature sensed by the temperature sensor, the controller controls the first driving member to move the first shielding plates to open or shield the air inlets, controls the second driving member to move the second shielding plates to open or shield the air outlets, and controls the first switch to turn on or turn off the exhaust fan.

2. The container data center of claim 1, further comprising a ventilation pipe communicating between the heat dissipation apparatus and at least one of the air inlets, wherein the ventilation pipe defines an opening communicating with the heat air channel, the ventilation pipe comprises a third shielding plate movably coupled to the ventilation pipe to cover the opening, the controller device further comprises a third driving member to move the third shielding plates, the third driving member is electrically coupled to the controller, the controller controls the third driving member to move the third shielding plates to open or shield the openings according to the temperature sensed by the temperature sensor.

3. The container data center of claim 2, wherein the heat dissipation apparatus further comprises a refrigeration unit, the controller device further comprises a second switch configured to control the refrigeration unit, when the temperature sensed by the temperature sensor is greater than a first predetermined temperature, the controller controls the first driving member, the second driving member, and the third driving member to move the first shielding plates, the second shielding plates, and the third shielding plate, the first shielding plates shield the air inlets, the second shielding plates shield the air outlets, and the third shielding plate opens the opening, the controller controls the second switch to turn on the refrigeration unit to generate cool air, the cool air flows into the cooling air channel through the vents, passes through the server cabinets and becomes heat air by absorbing heat of the server cabinets, the heat air flows into the heat air channel and enters into the heat dissipation apparatus through the openings.

4. The container data center of claim 2, wherein when the temperature sensed by the temperature sensor is less than a first predetermined temperature, the controller controls the first driving member, the second driving member, and the third driving member to move the first shielding plates, the second shielding plates, and the third shielding plate, the first shielding plates open the air inlets, the second shielding plates open the air outlets, and the third shielding plate shields the openings, the controller controls the first switch to turn on the exhaust fan to absorb air outside of the container from the air inlets, the air flows through the ventilation pipes and the heat dissipation apparatus, enters into the cooling air channel through the vents, passes through the server cabinets, and becomes heated air by absorbing heat of the server cabinets, the heat air flows into the heat air channel and flows out of the container through the air outlets.

5. The container data center of claim 2, wherein the control device further comprises a humidity sensor mounted to the outer side of the container, the humidity sensor is electrically coupled to the controller, when the temperature sensed by the temperature sensor is less than a first predetermined temperature and the humidity sensed by the humidity sensor is greater than a predetermined humidity, the controller controls the first driving member, the second driving member, and the third driving member to move the first shielding plates, the second shielding plates, and the third shielding plate, the first shielding plates open the air inlets, the second shielding plates open the air outlets, and the third shielding plate opens the opening, the controller controls the first switch to turn on the exhaust fan to absorb the air outside of the container from the air inlets and the air in the heat air channel from the opening, the air is mixed in the ventilation pipe, the mixed air passes through the heat dissipation apparatus, flows into the cooling air channel through the vents, passes through the server cabinets, and becomes heated air by absorbing heat of the server cabinets, the heated air flows into the heat air channel, one part of heated air enters into the heat dissipation apparatus through the opening, and the other part of the heated air flows out of the container through the air outlets.

6. The container data center of claim 2, wherein the control device further comprises a humidity sensor mounted to the outer side of the container, the humidity sensor is electrically coupled to the controller, when the temperature sensed by the temperature sensor is less than a first predetermined temperature and the humidity sensed by the humidity sensor is less than a predetermined humidity, the controller controls the first driving member, the second driving member, and the third driving member to move the first shielding plates, the second shielding plates, and the third shielding plates, the first shielding plates open the air inlets, the second shielding plates open the air outlets, and the third shielding plate shields the opening, the controller controls the first switch to turn on the exhaust fan to absorb air outside of the container from the air inlets, the air flows through the ventilation pipes and the heat dissipation apparatus, enters into the cooling air channel through the vents, passes through the server cabinets, and becomes heated air by absorbing heat of the server cabinets, the heat air flows into the heat air channel and flows out of the container through the air outlets.

7. The container data center of claim 2, wherein when the temperature sensed by the temperature sensor is less than a second predetermined temperature, the controller controls the first driving member, the second driving member, and the third driving member to move the first shielding plates, the second shielding plates, and the third shielding plate, the first shielding plates open the air inlets, the second shielding plates open the air outlets, and the third shielding plate opens the opening, the controller controls the first switch to turn on the exhaust fan to absorb the air outside of the container from the air inlets and the air in the heat air channel from the opening, the air is mixed in the ventilation pipe, the mixed air passes through the heat dissipation apparatus, flows into the cooling air channel through the vents, passes through the server cabinets, and becomes heated air by absorbing heat of the server cabinets, the heated air flows into the heat air channel, one part of heated air enters into the heat dissipation apparatus through the opening, and the other part of heated air flows out of the container through the air outlets.

8. The container data center of claim 1, wherein the container comprises a first sidewall and a second sidewall parallel to the first sidewall, the air inlets are defined in the first sidewall, the air outlets are defined in the second sidewall, the first sidewall and the server cabinets cooperatively bind the cooling air channel, the second sidewall and the server cabinets cooperatively bind the heat air channel.

9. The container data center of claim 8, wherein the first shielding plates are rotatably coupled to the first sidewall to cover the air inlets and the second shielding plates are rotatably coupled to the second sidewall to cover the air outlets.

10. The container data center of claim 2, wherein the third shielding plate is rotatably coupled to the ventilation pipe to cover the opening.

11. A container data center comprising:
  a container comprising:
    a first sidewall defining a plurality of air outlets;
    a second sidewall opposite to the first sidewall, wherein the second sidewall defines a plurality of air outlets;
    a top wall coupled between top portions of the first sidewall and second sidewall, wherein the top wall defines a plurality of air inlets;
    a plurality of first shielding plates movably coupled to the top wall to cover the corresponding air inlets; and
    a plurality of second shielding plates movably coupled to the first and second sidewalls to cover the corresponding air outlets;
  two rows of spaced server cabinets received in the container and located between the first and second sidewalls, the two rows of server cabinets cooperatively bind a cooling air channel communicating with the air inlets, the first and second sidewalls and the two rows of server cabinets cooperatively bind two heat air channels communicating with the corresponding air outlets;
  a heat dissipation apparatus located between each row of the server cabinets, wherein each heat dissipation apparatus comprises an exhaust fan, and each heat dissipation apparatus defines a plurality of vents communicating with the cooling air channel; and
  a control device comprising a first driving member configured for driving the first shielding plates to move, a second driving member configured for driving the second shielding plates to move, a temperature sensor mounted to an outer side of the top wall, a first switch configured to control the exhaust fan, and a controller electrically coupled to the first driving member, the second driving member, the temperature sensor, and the temperature sensor;
  wherein, according to a temperature sensed by the temperature sensor, the controller controls the first driving member to move the first shielding plates to open or shield the air inlets, controls the second driving member to move the second shielding plates to open or shield the air outlets, and controls the first switch to turn on or turn off the exhaust fan.

12. The container data center of claim 11, further comprising a ventilation pipe, wherein one ends of the ventilation pipe is communicated with the heat dissipation apparatus locating at one row of the server cabinets and the other end of the ventilation pipe is communicated with the corresponding heat dissipation apparatus locating at the other row of the server cabinets, each heat dissipation apparatus communicates with the corresponding air inlets, the ventilation pipe defines two openings communicating with the heat air channels, the ventilation pipe comprises two third shielding plates movably coupled to the ventilation pipe to cover the openings, the controller device further comprises a third driving member to move the third shielding plates, the third driving member is electrically coupled to the controller, the controller controls the third driving member to move the third shielding plates to open or shield the openings according to the temperature sensed by the temperature sensor.

13. The container data center of claim 12, wherein each heat dissipation apparatus further comprises a refrigeration unit, the controller devices further comprises a second switch configured to control the refrigeration unit, when the temperature sensed by the temperature sensor is greater than a first predetermined temperature, the controller controls the first driving member, the second driving member, and the third driving member to move the first shielding plates, the second shielding plates, and the third shielding plates, the first shielding plates shield the air inlets, the second shielding plates shield the air outlets, and the third shielding plates open the openings, the controller controls the second switch to turn on the refrigeration units to generate cool air, the cool air flows into the cooling air channel through the vents, passes through the server cabinets becomes heat air by absorbing heat of the server cabinets, the heat air flows into the heat air channel and enters into the heat dissipation apparatus through the openings.

14. The container data center of claim 12, wherein when the temperature sensed by the temperature sensor is less than a first predetermined temperature, the controller controls the first driving member, the second driving member, and the third driving member to move the first shielding plates, the second shielding plates, and the third shielding plates, the first shielding plates open the air inlets, the second shielding plates open the air outlets, and the third shielding plates shield the openings, the controller controls the first switch to turn on the exhaust fans to absorb air outside of the container from the air inlets, the air flows through the ventilation pipes and the heat dissipation apparatus, enters into the cooling air channel through the vents, passes through the server cabinets, and becomes heat air by absorbing heat of the server cabinets, the heat air flows into the heat air channel and flows out of the container through the air outlets.

15. The container data center of claim 12, wherein the control device further comprises a humidity sensor mounted to the outer side of the container, the humidity sensor is electrically coupled to the controller, when the temperature sensed by the temperature sensor is less than a first predetermined temperature and the humidity sensed by the humidity sensor is greater than a predetermined humidity, the controller controls the first driving member, the second driving member, and the third driving member to move the first shielding plates, the second shielding plates, and the third shielding plates, the first shielding plates open the air inlets, the second shielding plates open the air outlets, and the third shielding plates open the openings, the controller controls the first switch to turn on the exhaust fans to absorb the air outside of container from the air inlets and the air in the heat air channel from the openings, the air is mixed in the ventilation pipe, the mixed air passes through the heat dissipation apparatus, and flows into the cooling air channel through the vents, passes through the server cabinets, and becomes heated air by absorbing heat of the server cabinets, the heated air flows into the heat air channel, one part of heated air enters into the heat dissipation apparatus through the openings and the other part of the heated air flows out of the container through the air outlets.

16. The container data center of claim 12, wherein the control device further comprises a humidity sensor mounted to the outer side of the container, the humidity sensor is electrically coupled to the controller, when the temperature sensed by the temperature is less than a first predetermined temperature and the humidity sensed by the humidity sensor is less than a predetermined humidity, the controller controls the first driving member, the second driving member, and the third driving member to move the first shielding plates, the second shielding plates, and the third shielding plates, the first shielding plates open the air inlets, the second shielding plates open the air outlets, and the third shielding plates shield the openings, the controller controls the first switch to turn on the exhaust fans to absorb air outside of the container from the air inlets, the air flows through the ventilation pipes and the heat dissipation apparatus, enters into the cooling air channel through the vents, passes through the server cabinets, becomes heated air by absorbing heat of the server cabinets, the heat air flows into the heat air channel and flows out of the container through the air outlets.

17. The container data center of claim 12, wherein when the temperature sensed by the temperature sensor is less than a second predetermined temperature, the controller controls the first driving member, the second driving member, and the third driving member to move the first shielding plates, the second shielding plates, and the third shielding plates, the first shielding plates open the air inlets, the second shielding plates open the air outlets, and the third shielding plates open the openings, the controller controls the first switch to turn on the exhaust fans to absorb the air outside of the container from the air inlets and the air in the heat air channel from the openings, the air is mixed in the ventilation pipe, the mixed air passes through the heat dissipation apparatus, flows into the cooling air channel through the vents, passes through the server cabinets, and becomes heated air by absorbing heat of the server cabinets, the heated air flows into the heat air channel, one part of heated air enters into the heat dissipation apparatus through the openings, and the other part of heated air flows out of the container through the air outlets.

18. A data center comprising:
a container defining an interior space, the container having:
  a bottom wall with an interior surface facing the interior space;
  a first side wall substantially perpendicular to the bottom wall having one or more defined openings, a first side wall interior surface facing the defined space and a first wall exterior surface opposite, and substantially parallel, to the first wall interior surface; and
  a second side wall substantially perpendicular to the bottom wall and opposite, and parallel, to the first wall, the second wall having one or more defined openings and a second side wall interior surface facing the defined space and a second wall exterior surface opposite, and substantially parallel, to the second wall interior surface;
a plurality of server cabinets received within the interior space of the cabinet and laterally aligned parallel with the first side wall and the second side wall and between the first side wall interior surface and the second side wall interior surface;
a plurality of fans positioned between the plurality of server cabinets and the first side wall interior surface;
one or more refrigeration units placed in one or more refrigerating chambers positioned in alignment with the plurality of server cabinets;
one or more sensors exterior to the container;
at least one ventilation pipe positioned within the container interior space with a first end communicating with at least one of the one or more second side openings and a second end communicating with the container interior space and the one or more refrigeration chambers;
one or more first shielding plates moveably coupled to the first side wall exterior surface and positioned to selectively cover the one or more first side wall openings;
one or more second shielding plates moveably coupled to the second side wall interior surface and positioned to selectively cover the one or more second side wall openings;
at least one third shielding plate movably positioned to cover the second end of the at least one ventilation pipe;
one or more first rotation units, each first rotation unit configured to move one of the one or more first shielding plates;
one or more second rotation units, each rotation unit configured to move one of the one or more second shielding plates;
at least one third rotation unit, each rotation unit configured to move one of the at least one third shielding plates; and
a central processing unit, for activating the plurality of fans, the one or more refrigeration units, the one or more first rotation units, the one or more second rotation units and the at least one third rotation unit to cool the plurality of server cabinets in at least two or more configurations;
wherein, heated air channel is formed between the laterally aligned plurality of server cabinets and the one or more refrigeration chambers and the first side wall interior surface with the one or more first side wall defined openings communicating with the heated air channel, and a cooling air channel is formed between the laterally aligned plurality of server cabinets and the one or more refrigeration chambers and the second side wall interior surface with the one or more second side wall defined openings communicating with the cooling air channel;

wherein, each of the one or more refrigeration chambers communicates with the cooling air channel;

wherein, the second end of the at least one ventilation pipe communicates with the heated air channel;

wherein, the activation configurations of the central processing unit are based on input from the one or more exterior sensors;

wherein, in a first activation configuration, the one or more first shielding plates has been moved against the first side wall exterior surface by the one or more first rotation units, the one or more second shielding plates has been moved against the second side wall interior surface by the one or more second rotation units, the at least one third shielding plate has been moved away from the second end of the ventilation pipe by the at least one third rotation unit, the plurality of fans have been activated and are rotating, and the one or more refrigeration units have been activated to cool the refrigeration chambers;

wherein, in the first activation configuration, plurality of fans draws air from the cooling air chamber through the plurality of server cabinets, and into the heated air channel; and wherein, in the first activation configuration, the air from the heated air channel is drawn through the at least one ventilation pipe into the one or more refrigeration chambers and cooled by the one or more refrigeration units before being drawn into the cool air channel again.

19. The data center of claim 18, wherein when the temperature sensed by the temperature sensor is less than a first predetermined temperature, the controller controls the first driving member, the second driving member, and the third driving member to move the first shielding plates, the second shielding plates, and the third shielding plate, the first shielding plates open the air inlets, the second shielding plates open the air outlets, and the third shielding plate shields the openings, the controller controls the first switch to turn on the exhaust fan to absorb air outside of the container from the air inlets, the air flows through the ventilation pipes and the heat dissipation apparatus, enters into the cooling air channel through the vents, passes through the server cabinets, and becomes heated air by absorbing heat of the server cabinets, the heat air flows into the heat air channel and flows out of the container through the air outlets.

20. The data center of claim 18, wherein the control device further comprises a humidity sensor mounted to the outer side of the container, the humidity sensor is electrically coupled to the controller, when the temperature sensed by the temperature sensor is less than a first predetermined temperature and the humidity sensed by the humidity sensor is greater than a predetermined humidity, the controller controls the first driving member, the second driving member, and the third driving member to move the first shielding plates, the second shielding plates, and the third shielding plate, the first shielding plates open the air inlets, the second shielding plates open the air outlets, and the third shielding plate opens the opening, the controller controls the first switch to turn on the exhaust fan to absorb the air outside of the container from the air inlets and the air in the heat air channel from the opening, the air is mixed in the ventilation pipe, the mixed air passes through the heat dissipation apparatus, flows into the cooling air channel through the vents, passes through the server cabinets, and becomes heated air by absorbing heat of the server cabinets, the heated air flows into the heat air channel, one part of heated air enters into the heat dissipation apparatus through the opening, and the other part of the heated air flows out of the container through the air outlets.

* * * * *